United States Patent [19]

Mattuschka

[11] 4,326,142

[45] Apr. 20, 1982

[54] PIEZOELECTRIC RESONATORS

[75] Inventor: Werner Mattuschka, Munich, Fed. Rep. of Germany

[73] Assignee: Siemens Aktiengesellschaft, Berlin & Munich, Fed. Rep. of Germany

[21] Appl. No.: 83,261

[22] Filed: Oct. 10, 1979

[30] Foreign Application Priority Data

Oct. 20, 1978 [DE] Fed. Rep. of Germany ....... 2845807

[51] Int. Cl.³ ............................................. H01L 41/08
[52] U.S. Cl. .................................... 310/320; 310/364; 310/312
[58] Field of Search ............... 310/320, 364, 353, 365, 310/366, 312

[56] References Cited

U.S. PATENT DOCUMENTS

| 2,635,199 | 4/1953 | Wolfskill | 310/353 X |
| 2,699,508 | 1/1955 | Fastenau, Jr. | 310/353 |
| 3,363,119 | 1/1968 | Koneval et al. | 310/320 |
| 3,401,276 | 9/1968 | Curran et al. | 310/320 |
| 4,130,771 | 12/1978 | Bottom | 310/312 |
| 4,218,631 | 8/1980 | Yamaguchi | 310/320 X |

Primary Examiner—Mark O. Budd
Attorney, Agent, or Firm—Hill, Van Santen, Steadman, Chiara & Simpson

[57] ABSTRACT

A wafer of piezoelectric material is provided with electrodes on opposite surfaces thereof. Frequency fine tuning of such resonators is accomplished by relatively thin film of metal applied over the surface of at least one electrode and the adjacent non-electroded wafer material. The metal film is of such small maximum thickness that it functions as a quasi-insulator and is extremely stable over prolonged operating conditions so that the resonator parameters remain constant.

6 Claims, 2 Drawing Figures

PIEZOELECTRIC RESONATORS

BACKGROUND OF THE INVENTION

1. Field of the Invention

The invention relates to piezoelectric resonators and somewhat more specifically to improved resonators for use in electronic filter circuits.

2. Prior Art

Piezoelectric resonators comprised of a relatively thin wafer of a piezoelectric material having at least one resonance electrode positioned on a major surface thereof and having wafer areas adjacent such electrode which is free of electrodes, along with a dielectric non-conductive film over the electrode and the adjacent electrode-less wafer surface areas are known, for example from U.S. Pat. No. 3,401,276 (which is incorporated herein by reference and provides further details concerning such resonators).

With these types of known resonators, electrodes are applied by vapor deposition so as to bring about a resonance frequency of the thickness shear modulation in the region of the resonator which is covered by electrodes, which is only 0.8 times the value of the resonance frequency of the resonator in the non-electroded resonator region. In this manner, the active region of the resonator, i.e., the region thereof which vibrates, is concentrated in the electrode-covered region of the resonator. In order to be able to maintain this favorable relationship between the resonance frequency in the electrode region of the resonator and the electrode-less region of the resonator and to attain a fine frequency tuning, a coating is additionally applied onto the resonator electrodes and is permitted to extend onto at least one side of the resonator wafer across the total surface of the resonator on this side. In this manner, the resonance frequency in the electrode region and the resonance frequency in the electrode-less region is lowered and the relationship between these resonance frequencies is, essentially, left unaltered. The earlier noted U.S. Pat. No. 3,401,276 suggests that the coating, which is provided so as to extend over at least one major surface of the resonator, be composed of a material which has a high surface resistance, for example, silicon monoxide or anodized (i.e., oxidized) aluminum or oxidized tantalum. In other words, the prior art suggest utilizing dielectric materials having a high Q-value. Otherwise, the resonance electrodes would again be enlarged in an undesirable manner.

However, the application of a dielectric material coating is technically relatively expensive and disadvantageous in that the properties of such coating materials are timedependent. In other words, undesirably large changes of important operational parameters of the resonator occur as a result of aging effects, recrystallization processes and the like.

SUMMARY OF THE INVENTION

The invention provides an improved piezoelectric resonator of the type above described having a coating on at least one side of the resonator and extending beyond the resonance electrode, which coating eliminates or at least minimizes changes of important resonator parameters, such as caused by aging processes or the like. Accordingly, a resonator constructed in accordance with the principles of the invention exhibits a high temporal constancy of operational parameters.

In accordance with the principles of the invention, the coating applied onto at least one surface of a piezoelectric resonator over at least one electrode on such surface and extending beyond such electrode onto an adjacent electrode-less region of the resonator is comprised of a metal film having a maximum thickness, $(d_{max})$ in nanometers of about $682/\sigma_x$ wherein $\sigma_x$ is the specific conductance of the selected metal.

Preferably, metal used in forming such coatings are selected from the group consisting of gold, silver and aluminum. Such coating can be applied to the select resonator surface area or region in any select manner, such as vapor-deposition, sputtering or the like. The coating is provided on at least one major surface of a resonator and can extend over the entire surface area. Alternatively, such coating can be provided with an opening corresponding to an edge side working surface of a connecting element which is coupled with a resonance electrode on the opposite side of the resonator away from the side thereof containing the coating. In this manner, the coating on one side of a resonator is separated or insulated from a coating on the other side, in instances where coatings are provided on both sides of a resonator. This alternative embodiment is particularly useful in instances where extremely high demands are placed on the resistance between the working points of a connecting element for the resonator. Such connecting elements are, in each case, connected with only a resonance electrode on one side of the resonator.

DESCRIPTION OF THE PREFERRED EMBODIMENTS

Figure 1:
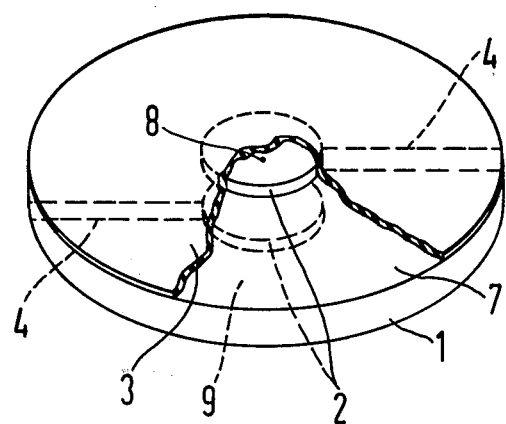
FIG. 1 is a perspective view, partially in section and partially in phantom, illustrating an exemplary piezoelectric resonator embodying the principles of the invention.

For the purposes of promoting and understanding of the principles of the invention, reference will now be made to the embodiments illustrated in the drawings and specific language will be used to describe the same. It will nevertheless be understood that no limitations of the scope of the invention is hereby intended, such alterations and further modifications in the illustrated devices, and such further applications of the principles of the invention as illustrated therein being contemplated as would normally occur to those skilled in the art to which the invention relates.

In the drawings, like elements are referenced with like numerals. Referring now to the drawings, there is shown an operative circular disk-shaped resonator 1 which is, in the exemplary embodiment here under discussion, a thickness shear modulator and generally comprises a relatively thin wafer of a piezoelectric material having opposing major surfaces 7, each of which are provided with at least one resonance electrode 2. The electrodes 2 are illustrated as also being of circular disk-shape and are preferably positioned concentrically with the resonator center point 8. The electrodes are comprised, as is known, of a relatively thin gold, silver or aluminum film vapor deposited onto the select areas of a major surface 7 of the resonator 1 so as to have a select thickness which is such that it exhibits a disregardably low surface resistance. Further, the thickness of the resonance electrode 2 is selected so that a concentration of the active vibrating region of the resonator occurs in the region of the resonance electrodes via a so-called "energy trapping". It is also to be noted that the resonance electrodes 2 must coincide with, i.e., be positioned on, the major surfaces 7 of a resonator.

By proper dimensioning of the diameter of the resonance electrodes relatively to the diameter of the circular disk-shaped resonator 1, a circular ring-shaped resonator region 9 which is not covered by a resonance electrodes is attained. The region 9, which is sometimes referred to herein as an electrode-less region, is present on both sides of the resonator 1. The resonator is, to a large extent, vibration-free in this electrode-less region so that the resonator can be connected with or grasped by coupling elements 5 and 5a (FIG. 2) at two periphery points along opposing diameter ends of the resonator without influencing the vibration characteristics thereof in any manner worth mentioning. In order to facilitate a connection between the coupling elements 5 or 5a with one of the two resonance electrodes 2, strip-shaped leads 4 are provided. The leads 4 extend on each side of the resonator from one resonance electrode to the working surface of one of the coupling elements 5 or 5a and thus extend to opposite peripheral edges of the resonator.

In order to attain fine frequency tuning of the exemplary resonator illustrated in FIG. 1, a coating 3 is provided so as to cover the total surface on at least one side of the resonator. This coating is composed of an extremely thin metal film, preferably composed of a metal selected of a group consisting of gold, silver, and aluminum. After extensive investigations, it has been determined that the thickness of metal layer 3 must not exceed the value of $682/\sigma_x$ in nanometers wherein $\sigma_x$ is the specific conductance of the metal comprising the film.

The extremely thin metal films utilized in accordance with the principles of the invention for fine frequency tuning are quasi-insulating in that they exhibit such a large surface resistance that their electrical conductance capacity cannot take effect in any interfering manner. These thin metal films, which can be simply applied onto piezoelectric materials by vapor deposition or the like, are very resistant to aging or recrystallization so that such coatings, which provide the desired fine frequency tuning of thickness shear modulators, do not unfavorably change the resonator parameters even after prolonged periods of time.

For example, if one selects gold for forming the coating 3 and substitutes the specific conductance of gold, 45.5, for $\sigma_x$ in the expression $682/\sigma_x$, then one obtains a maximum layer thickness of 15 nanometers for a layer composed of gold. Similarly, for silver, a maximum thickness, $d_{max}$ of approximately 11 nanometers results (specific conductance of silver is 62.5) and for a coating composed of aluminum, a maximum thickness, $d_{max}$ of approximately 18.5 nanometers results (specific conductance of aluminum is 37).

The extremely thin metal films provided on piezoelectric bodies function substantially the same as the coating composed of a dielectric material. In other words, thin metal films have such large surface resistances that it brings about no undesirable enlargement of the resonance electrode, in view of the very low surface resistance of such electrodes.

Despite the extremely small thickness of the coating 3 necessary to achieve fine frequency tuning, it is still adequate to allow relatively large frequency changes to occur. As is known, the resonance frequencies of thick shear modulators are in the range of megahertzes. For example, in an exemplary embodiment, wherein the coating 3 is comprised of aluminum and was the maximum thickness above specified, in the case of a resonance frequency of 20 MHz (fundamental vibration), a maximum frequency change of approximately 4 kHz can be attained; similarly, when the coating 3 is composed of silver, a maximum frequency change of about 10 kHz can be attained and when the coating 3 is composed of gold, a maximum frequency of about 26 kHz can be attained. With a vibration frequency (resonance frequency) of 25 MHz, the corresponding frequency changes that can be attained are 7kHz, 16 kHz and 41 kHz respectively. In instances of resonators which are operated with the third overtone, the resultant maximum frequency change which can be attained is approximately 4 kHz in the case of aluminum, approximately 8 kHz in the case of silver and approximately 20 kHz in the case of gold, with a vibration frequency of 30 MHz. In instances of a vibration frequency of 50 MHz (3rd overtone), the corresponding frequency change values are approximately 9, 21 and 55 kHz. In instances of a vibration frequency of 75 MHz (3rd overtone), the frequency change values are about 21, 48 and 122 kHz respectively. All of the foregoing values are applicable to resonators provided with a coating only on one of their respective major surfaces. In embodiments where the coating is provided on both major surfaces, of course, the foregoing values double.

Figure 2:
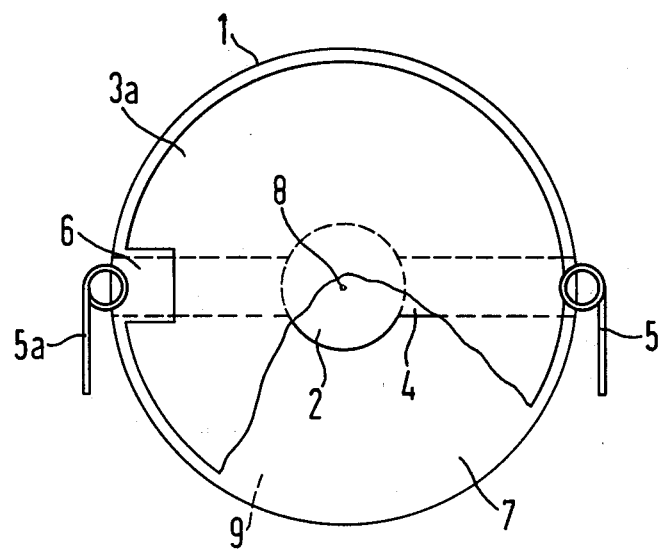
FIG. 2 is a top view of an alternative embodiment of a piezoelectric resonator incorporating the invention.

In the exemplary embodiment illustrated at FIG. 2, the coating 3a is provided with an opening 6 in the region of the working surface of the connecting element 5a, which in turn is connected (via the lead 4) with the resonance electrode 2 on the side of the resonator 1 which is not shown so that in this opening region, the resonator surface 7 remains uncovered by the coating 3. In this manner, particularly where high demands are made with respect to the insulator resistance between the connecting elements 5 and 5a, or respectively, between the two resonance electrodes 2, a connection, even if very highly-ohmic, between the coupling elements 5 and 5a over the coating 3 is avoided. Embodiments of the invention which utilize such openings in coating 3 are of particular utility where extremely high resistant demands between the two coupling elements 5 and 5a exist.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. An operational piezoelectric resonator comprised of a thin body composed of a piezoelectric material and having two opposing major surfaces, at least one resonance electrode positioned on at least one of said major surfaces of such body, said body having regions on said major surfaces thereof free of said resonance electrodes and a relatively thin metal coating on said electrode and extending beyond said electrode onto said body regions free of electrodes, said metal coating having a maximum thickness, in nanometers, of about $682/\sigma_x$ wherein $\sigma_x$ is the specific conductance of the metal forming said coating, said metal being gold.

2. A piezoelectric resonator as defined in claim 1 wherein said metal coating is provided on at least one major surface of said resonator and extends over the total surface area of such major surface.

3. A piezoelectric resonator as defined in claim 1 wherein said metal coating is provided on at least one major surface of said resonator and is provided with an opening corresponding to an edge-side working surface of a coupling element which is in connection with a resonance electrode on an opposite major surface from said one major surface of said resonator, said opening-containing coating being insulated from a metal coating on said opposite major surface.

4. An operational piezoelectric resonator comprised of a thin body composed of a piezoelectric material and having two opposing major surfaces, at least one resonance electrode positioned on at least one of said major surfaces of such body, said body having regions on said major surfaces thereof free of said resonance electrodes and a relatively thin metal coating on said electrode and extending beyond said electrode onto said body regions free of electrodes, said metal coating having a maximum thickness, in nanometers, of about $682/\sigma_x$ wherein $\sigma_x$ is the specific conductance of the metal forming said coating, said metal being silver.

5. A piezoelectric resonator as defined in claim 4 wherein said metal coating is provided on at least one major surface of said resonator and extends over the total surface area of said major surface.

6. A piezoelectric resonator as defined in claim 4 wherein said metal coating is provided on at least one major surface of said resonator and is provided with an opening corresponding to an edgeside working surface of a coupling element which is in connection with a resonant electrode on an opposite major surface from said one major surface of said resonator, said opening-containing coating being insulated from a metal coating on said opposite major surface.

* * * * *